United States Patent [19]

Mokhtar et al.

[11] Patent Number: 5,652,547
[45] Date of Patent: Jul. 29, 1997

[54] CURRENT COMPARATOR AUTOMATIC OUTPUT CONTROL

[75] Inventors: Fuad Haji Mokhtar, Kedah; Chee Seong Por, Penang, both of Malaysia

[73] Assignee: Motorola, Inc., Schaumburg, Ill.

[21] Appl. No.: 526,186

[22] Filed: Sep. 11, 1995

[30] Foreign Application Priority Data

Jun. 20, 1995 [MY] Malaysia .............. PI 9501670

[51] Int. Cl.$^6$ ...................................... H03G 3/30
[52] U.S. Cl. ................... 330/279; 330/139; 330/140; 455/126
[58] Field of Search .................. 330/129, 138, 330/139, 140, 278, 279, 285; 455/126, 127

[56] References Cited

U.S. PATENT DOCUMENTS

| 3,449,680 | 6/1969 | Schilb et al. .............. 330/298 |
| 4,234,853 | 11/1980 | Yamaguchi ............ 330/284 X |
| 4,307,348 | 12/1981 | Nicholson ............. 330/279 X |
| 4,456,889 | 6/1984 | Kumar ................. 330/279 |
| 4,523,155 | 6/1985 | Walczak et al. .......... 330/279 |
| 4,602,218 | 7/1986 | Vilmur et al. ........... 330/279 |
| 5,381,115 | 1/1995 | Timmons et al. .......... 330/279 |

FOREIGN PATENT DOCUMENTS

| 144164 | 11/1979 | Japan ................. 330/279 |
| 244107 | 12/1985 | Japan ................. 330/279 |

OTHER PUBLICATIONS

The Norton Amplifier LM3900 taken from the National Semiconductor Corp Linear Applications Handbook (1986) Application No. 72 by T.M. Frederiksen.

*Primary Examiner*—James B. Mullins
*Attorney, Agent, or Firm*—Juliana Agon; Frank M. Scutch, III

[57] ABSTRACT

A circuit for controlling the output level of a power amplifier is disclosed. A current comparator (230) compares a reference current with a sensed current which is representative of the power amplifier current state. The reference current is used not only for comparison with the sensed current but also for setting the power amplifier (104). The current comparator (230) provides an output, based on the comparison, that is coupled to the power amplifier so that the power amplifier current is maintained at an optimum level for minimizing temperature dependent variations and substantially leveling the power of the power amplifier.

15 Claims, 3 Drawing Sheets

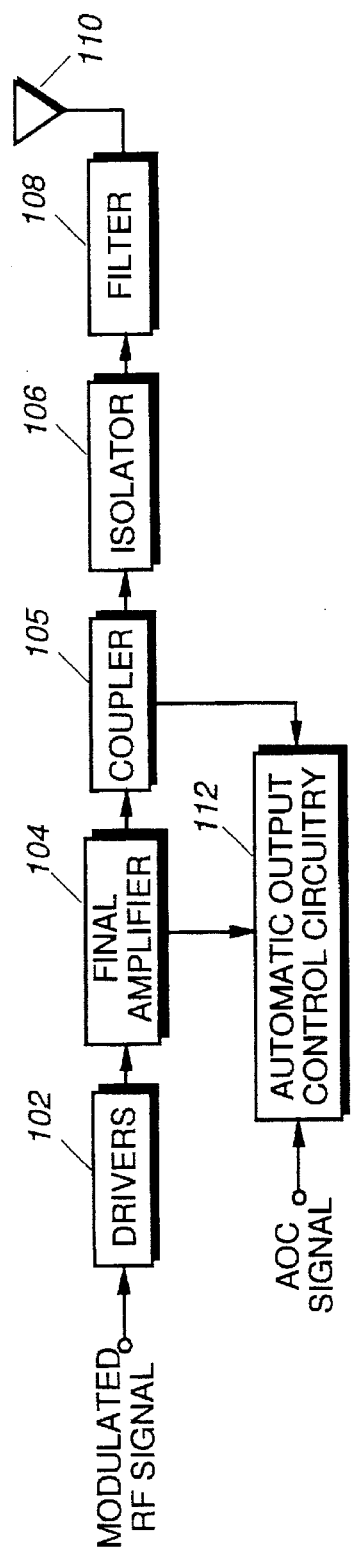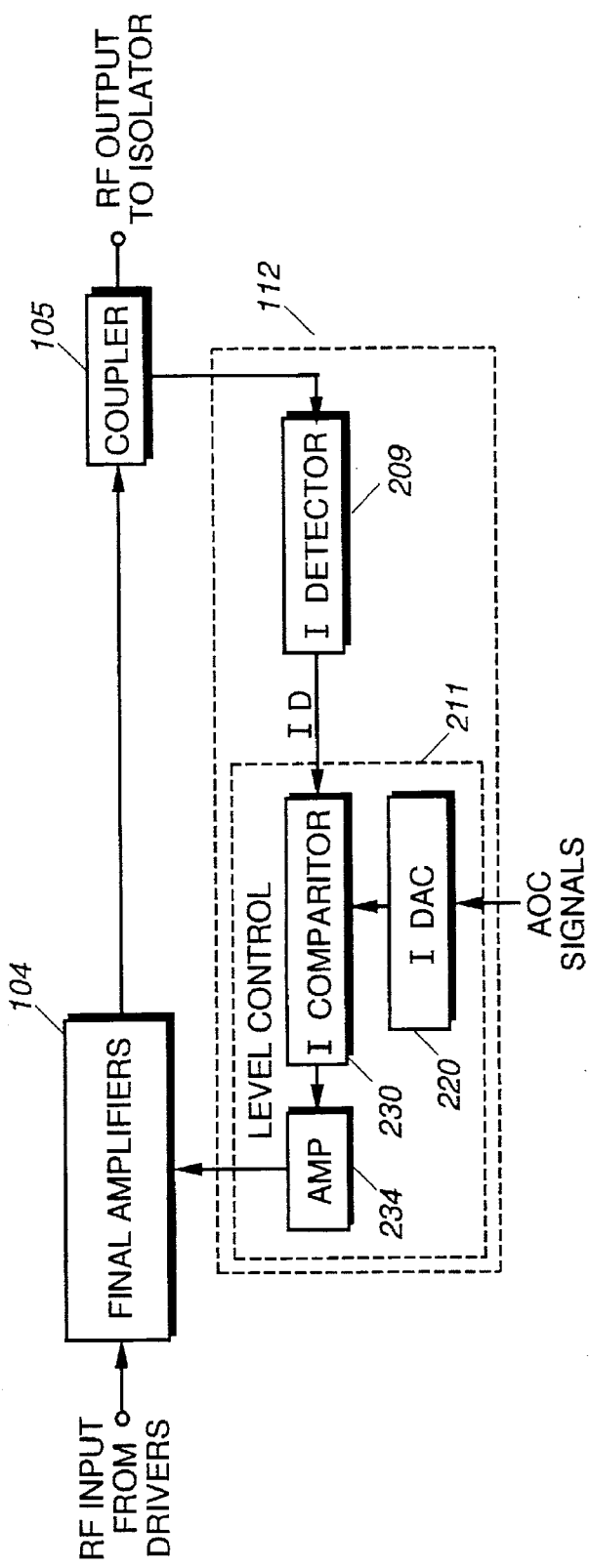

CURRENT COMPARATOR AUTOMATIC OUTPUT CONTROL

TECHNICAL FIELD

This invention relates in general to control circuits for radio frequency (RF) signal power amplifiers, and more particularly to improved temperature compensated automatic output control circuitry for RF signal power amplifiers.

BACKGROUND OF THE INVENTION

Applying a reference voltage to an automatic output control circuitry for maintaining a particular power level is well known in the radio arts. Known automatic output control circuitry use voltage comparators for comparing the reference voltage against the power output. However, the performance of voltage comparators may degrade over low voltage levels, such as a detected RF voltage level below 0.5 V, and especially over a wide temperature range. Accordingly, there is a need to provide an improved temperature compensated automatic output control circuitry for RF signal power amplifiers that accurately maintains the desired power setting at low power levels and across the temperature range.

SUMMARY OF THE INVENTION

Briefly, according to the invention, there is provided a circuit for controlling the output level of a power amplifier. A current comparator compares a reference current with a sensed current which is representative of the power amplifier current state. The reference current is used not only for comparison with the sensed current but also for setting the power amplifier. The current comparator provides an output, based on the comparison, that is coupled to the power amplifier so that the power amplifier current is maintained at an optimum level for minimizing temperature dependent variations and substantially leveling the power of the power amplifier.

BRIEF DESCRIPTION OF THE DRAWINGS

FIG. 1 is a block diagram of an RF power amplifier including the automatic output control circuitry in accordance with the present invention.

FIG. 2 is a block diagram of the automatic control circuitry, the final amplifiers, and the coupling there between.

DETAILED DESCRIPTION OF THE PREFERRED EMBODIMENT

Figure 3:
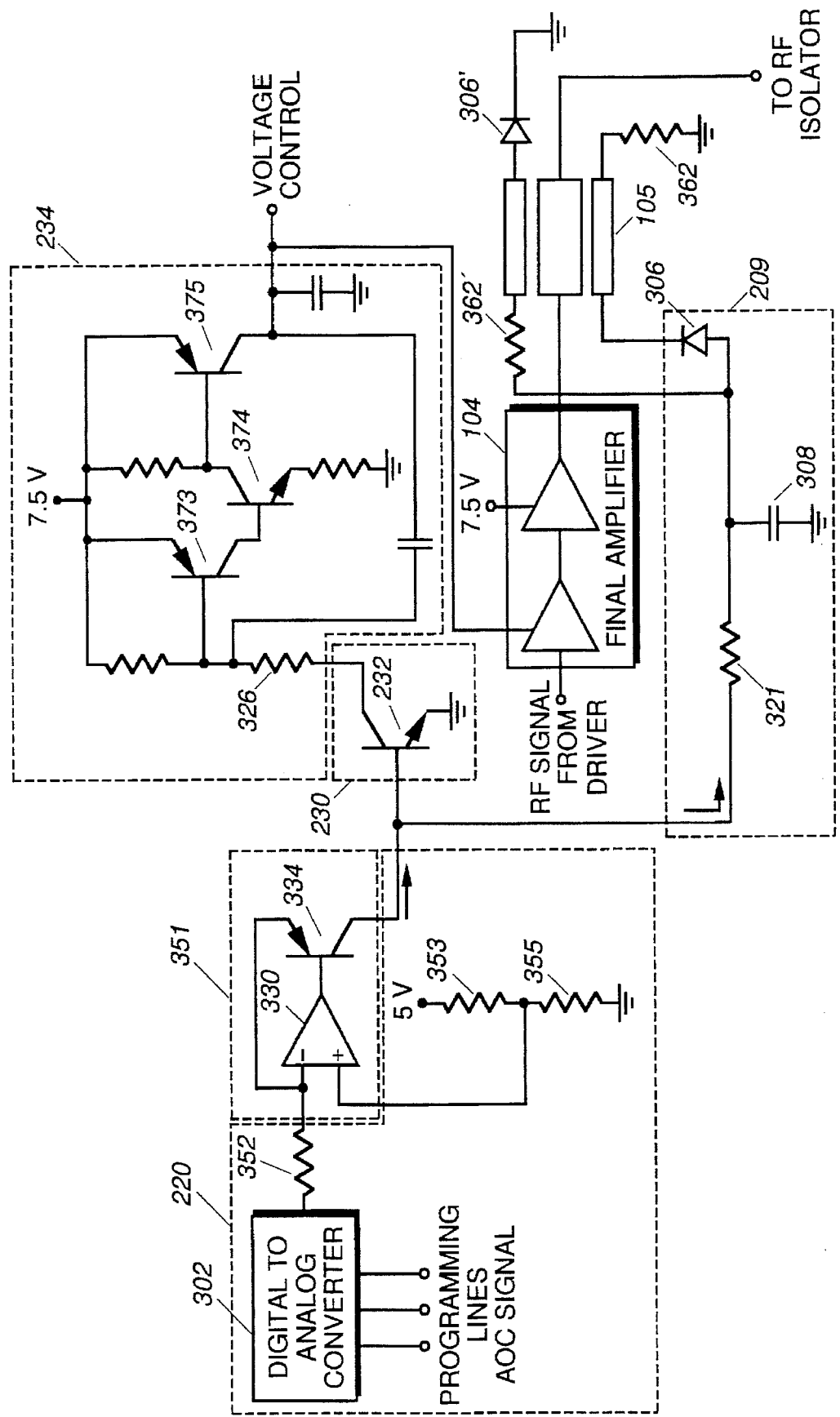
FIG. 3 is a detailed circuit diagram of the automatic output control circuitry of FIG. 2 using a half-wave rectifier.

Referring to FIG. 1, there is illustrated a radio frequency RF signal power amplifier that may advantageously utilize automatic output control (AOC) circuitry embodying the present invention in a radio having a transmitter and a receiver. An RF signal power amplifier is typically part of a radio transmitter that includes an RF signal power amplifier for amplifying a modulated RF signal which will be radiated by an antenna. The RF signal power amplifier includes two cascaded stages of amplification, drivers 102 and voltage-driven final amplifiers 104. The output of final amplifier 104 is sampled by way of a transmission line coupler 105 and fed-back by an AOC circuitry 112 to the final amplifier 104. The rest of the output of the final amplifier 104 as coupled by the coupler 105 is isolated by an isolator 106 and filtered by a filter 108 before reaching an antenna 110 for eventual transmission. The boosted output power level of final amplifier 104 developed by final amplifiers 104 is proportional to the control voltage applied by AOC circuitry 112.

AOC circuitry 112 detects the magnitude of the RF signal from final amplifiers 104 and varies the control voltage applied to final amplifiers 104 for maintaining the magnitude of the final amplifier output at the predetermined magnitude selected by an AOC signal. The AOC circuitry of the present invention maintains the output power level to within plus and minus two decibels (dB) of the selected level over temperature.

Referring to FIG. 2, further detail of the block diagram of the automatic output control circuitry 112 is illustrated. A sample of the RF output from the final amplifier 104 is derived by the transmission line coupler 105 and is coupled to the automatic output circuitry 112. As is known, coupling may be achieved by other RF sensing means or RF coupling elements, such as a directional coupler, or an energy field probe to provide a sensed RF voltage.

The automatic output control circuitry 112 basically includes the two functions shown in block diagram form in FIG. 2. The sample signal is applied to a current detector 209. The current detector 209 converts the sample signal to a direct current signal representative of the RF power output, or sensed current, which can be termed a power magnitude detected current signal Idet. The power magnitude signal Idet is coupled to a level controller 211 which employs the power magnitude signal and the AOC control signal to produce the current control signal applied to final amplifiers 104 to control its gain. The level controller 211 uses a current comparator 230 to compare the power magnitude signal Idet with the reference current Iref derived from the application of a current digital-to-analog converter (DAC) 220 or any other current reference level control to the AOC signal to determine the output current, taking account already of any error current reduction or gain that is needed, if any, to the output current. This output current is amplified by a high gain DC current amplifier 234 that could be implemented as an operational amplifier. Since the final amplifier 104 is voltage driven by the impedance of the final amplifier 104 control line which is resistive, the output current from the current amplifier 234 will automatically generate a control voltage to drive the voltage driven final amplifier 104.

Referring to FIG. 3, there is illustrated a circuit diagram of the automatic output control AOC circuitry 112 of FIG. 1 in greater detail. In accordance with the teachings of the present invention, the improved automatic output control circuitry is used to control the RF power amplifier output power. This improved AOC includes an RF coupling element (in this case a transmission line coupler 105 is used), an RF detector made-up of a half-wave diode rectifier 306 and a capacitor 308, a dc current comparator 230, a very high gain dc three transistors current amplifier 234 including transistors 373, 374, and 375, a voltage-to-current converter comprised of an operational amplifier op-amp 330 and 334 and an input source such as a programmable voltage source made-up of an analog-to-digital converter ADC 302 used to control the RF power setting.

The current DAC 220 includes a DAC 302 and a voltage-to-current converter 351. The voltage-to-current converter 351 is made-up of a voltage comparator operational amplifier 330 and a diode-connected current amplifier 334.

The DAC is basically a programmable voltage source used to control the RF power setting. A current DAC or any other current reference level control 220 draws a reference current Iref through the voltage-to-current converter 351 connected to the digital-analog-converter (DAC) 302 reading the programmed referenced voltage. The current DAC 220 is a current source or just a input current reference which may be as simple or complex as required in a particular application. An AOC signal in the form of three programming lines are coupled to the digital-to-analog converter DAC 302 for applying a power magnitude reference, setting, or input control voltage Vdac to the inverting or negative input of the voltage comparator 330 of the voltage-to-current converter 351 by way of a voltage dividing resistor 352 to attenuate the power magnitude signal by a selected reference amount. The AOC signal can be provided by a signal source such as in a radio control circuitry of a microprocessor or controller. The microprocessor may also include a memory for storing the plurality of programming voltages. Each of these predetermined programming voltage represents a given range for the amplifier output signal such that the controller can provide one of these programming voltages to derive the reference current. In this manner, the RF power amplifier gain and output power is controlled by varying the DAC voltage, power magnitude reference, or setting voltage.

The positive input or non-inverting input of the voltage comparator 330 of the voltage-to-current converter 351 is coupled to an off-set voltage provided by two resistors 353 and 355. The values of the resistors 353 and 355 are selected to enable the final amplifier 104 to provide the desired power output for the lowest power level selection. The programming lines to the DAC apply the appropriate power magnitude signal at the inverting input of the comparator 330 to set the actual power level desired at the comparator output.

A current source Iref is derived from the application of the voltage-to-current converter 351 to the output of a Digital-to-Analog Converter (DAC) 302. Hence, the programmable voltage source supplied by the digital-to-analog converter is the actual input that controls the whole AOC system. The reference input source can be simplified if a current source is not absolutely necessary to the power amplifier leveling operation. For example, if just a reference current is sufficient, the current can be provided by the DAC 302 and the resistor 352 without the transistor 334 and the operational amplifier 330 being present. Since this AOC circuitry requires a current for its reference, this DAC voltage has to be converted into a current input first. This converting function is done by the voltage comparator operational amplifier 330 and the current amplifier 334. The reference current Iref then is derived from the following relationship:

$$Iref=(Vdac-Voffset)/(Resistor\ 352+Rdac)=a\ constant \quad (eq.\ 1)$$

where Rdac is the output impedance or internal resistance of the DAC.

In the current detector 209, the output from the final driver 104 is coupled by a transmission line coupler 105 preferably in the form of a 30 dB directional coupler that is terminated by a termination resistor 362 at a first incident port of the transmission line. This coupled final driver output is rectified by a half-wave rectifier or diode peak rectifier formed by a forward biased detector diode 306 at a first reflected port of the transmission line. The detector diode 306 is under forward biased condition only when the reference current Iref exists. When the reference current Iref flows into the circuit, it will generate a 0.7 volt voltage across the base-emitter junction of the current comparator amplifier 232 and will automatically forward bias the detector diode through a bias resistor 321. Without an RF signal being present, the detected voltage Vdet across the diode 306 is the same as the bias voltage (0.7 volt) of the transistor 232. The bias current is then the following KVL relationship around the base-emitter loop of the transistor 232:

$$Ibias=Ibase=(Vbe-Vd)/(resistor\ 321+resistor\ 362) \quad (eq.\ 2)$$

The negative voltage swings of the sensed voltage at the cathode of the diode 306 is reversed biased by the final amplifier voltage sample tapped off by the coupler 105. The direct current DC voltage produced by the rectified sample signal is filtered by a filtering resistor 321 (to provide the sensed current or detector current Idet) and the detector capacitor 308 to become the output power magnitude signal. This current detector 209 then rectifies and filters the tapped-off portions of the final amplifier output to produce a detected output signal whose voltage amplitude increase in a predetermined polarity (from 0.7 V positive to a greater negative voltage) in response to an increase in the power level of the final amplifier output.

When the negative voltage swings of the RF signal start getting rectified by the diode 306 a detect current Idet is created. Since the polarity of the rectified voltage is negative, it will pull the detected voltage Vdet towards the negative side, causing a greater potential difference between the terminals of the resistor 321. In this manner the detected current Idet is generated as seen in equation 3 and illustrated by the following example of Table 1 assuming the resistor 321 is 10 kohm.

$$Idet=(0.7\ V-Vdet)/Resistor\ 321\ where\ R321>>R362 \quad (eq.\ 3)$$

TABLE 1

| RF Power | Iref | Vdet | Idet | Ibase |
|---|---|---|---|---|
| 0 mW | 0 uA | 0.7 V | 0 uA | 0 uA (cut-off) |
| 50 mW | 11 uA | 0.6 V | 10 uA | 1 uA (active) |
| 5 W | 1.1 mA | −0.3 V | 0.1 mA | 1 mA (saturated) |
| 35 W | 1.26 mA | −1.9 V | 0.26 mA | 1 mA (saturated) |

Applying Kirchoff's voltage law to the base circuit of the transistor, equation 4 results and the results are seen in table 1:

$$Iref=Idet+Ibase \quad (eq.\ 4)$$

Thus, according to eq. 4, at any operational mode of the transistor 232 (cut off, saturated or linear) Iref is a constant equal to the base current and the detected current, unless the setting is changed by the programming voltage reference signal. The reference current Iref is also forced to be a constant especially if it comes from a current source. This constant reference current means that the detected current Idet can never go higher than the reference current Iref. If the detected current Idet is about to go higher than the reference current Iref it will steal the Ibase_min from the transistor 232 and the ALC amplifier 234 will ramp down the control voltage.

Hence, the RF PA gain and output power is controlled by varying its control voltage, while the RF output (final amplifier) power is detected by rectifying the negative swings of the RF voltage on the coupler 105. Because the rectify diode 306 is configured in such a way that the detected voltage is in negative polarity as coupled by the coupler 105 to the cathode of the diode 306, an inverse relationship exists. The higher the control voltage, the higher the output power, and the higher the output power the higher the detected voltage (but in a negative polarity). Conversely, the lower the control voltage, the lower the output power, and the lower the output power the lower the detected voltage (but in a negative polarity).

Optionally, a second diode 306' can serve as a second detector. This second diode 306' is used to detect the reverse or reflected power at the second reversed port of the transmission line 105. Two or more such voltage detectors can be joined together as long as they are configured in parallel. The detector that detects the higher power at any one time will dominate this rectifying function. To ensure that the current comparator 230 could perform with a minimum base current Ibase-min of 0.1 uA, the current comparator 230 is followed by a very high gain current amplifier consisting of transistors 373, 374 and 375. These three current amplifiers 373, 374 and 375 act together to provide a voltage control Vcontrol signal for varying the power output of the final amplifier 104 of the power amplifier in response to the collector current provided by the current comparator transistor 232.

By using the very high gain DC amplifier 234, the reference current Iref only have to be in the order of one micro ampere (minimum base current Ibase-min) in order to activate both the bipolar transistor 232 and the high gain DC amplifier 234 ON. In this steady-state, the base current of the current comparator transistor 232 is considered to be negligible. The current comparator 230 will then compare the reference current Iref versus detected current Idet and try to maintain the detected current Idet to be the same as reference current Iref by controlling the RF PA output power.

The current comparator 230 uses a common-emitter current transistor amplifier 232 having a base input coupled to an input base current node and a collector output. Characteristically, this bipolar transistor 232 has the three transistor well-known operating regions for controlling the collector output in response to the base input by design. In operation, the transistor 232 references the detect current Idet against the reference current Iref at the base input node.

The transistor 232 operates in a first cut-off region when the base input has an insufficient base current determined by setting the transistor operating characteristics. This insufficient base current, less than one micro ampere de-activates the transistor 232 such that an insufficient collector current also results as the input to the amplifier gain stage 234. In turn, this insufficient collector current slowly reduces the gain of the amplifier gain stage 234 in response to a first greater than reference current signal condition when the detected current is about to go higher than the reference current.

If Idet from the detector diode acting as a current drain flows and is too high because of receiving a too high of a signal detected voltage coupled from the transmission line coupler 105 as rectified by the diode 306, the resultant negative detected voltage will reduce the base emitter voltage of the transistor 232. When the detected current Idet is about to go higher than the reference current Iref, the detected current Idet will steal the minimum base current requirement Ibase_min (1 uA) from the input of the base of the transistor 232 and the ALC amplifier 234 will ramp down the control voltage. This relationship results because when the detected current Idet flows, the forward biased diode 306 steals the needed base drive from the transistor 232. This insufficient base current decreases the base emitter voltage drop Vbe, which tends to shut-off the NPN transistor 232.

The reduced base emitter voltage will not turn that transistor ON, such that the collector current IC will not flow at that instant to slowly reduce the output power.

As the transistor 232 begins to shut-off, its collector current begins to fall, which is used to supply the base current to the high gain amplifier transistor 373 via a resistor 226. The falling base current of the high gain amplifier transistor 373 tends to decrease the control voltage, thus offsetting the attempted rise in detected current that triggered the feedback adjustment.

In the second saturation operation mode of the transistor 232, the base input has an exceedingly large base current flowing into the base. If no current is flowing across the detector diode because of insufficient output power signal voltage detected by the detector diode 306 or the detect current is otherwise much less then the reference current, the base transistor current will be an exceedingly large base current to cause the transistor 232 to go into the saturated state and to cause the high gain amplifier 234 to provide maximum gain. This high base current provides a maximum collector current as the input to the amplifier gain stage for providing the maximum power gain in response to a second much less than reference current condition when the detected current is much less than the reference current.

During steady state and majority of the time, a third active mode of the transistor operates wherein the magnitude of the base input current is within a linear range of base currents magnitudes for providing a linearly-related collector current. This linearly-related collector current is applied to the base input of the amplifier gain stage 234 for linearly adjusting the output of the amplifier gain stage 234 in relation to the reference current to thereby maintain a desired amplifier output signal in response to a third about equal signal condition when the detected current is the same as the reference current. This steady-state situation should be happening most of the time by operating transistor load design since the reference current would not be diverted and all of the reference current is applied to the base of the transistor 232.

Preferably, the reference current Iref is always programmed to be greater than the expected detected current by just one micro ampere such that the difference of at least one micro ampere is enough to activate the transistor 232 ON to ensure that the reference current Iref will be used most of the time, during steady-state, to set the output power level. The collector current IC to the current amplifier 234 will be a proportionality constant multiplied by the reference Iref to maintain the control voltage applied to the final amplifier 104 as a constant multiplier of the reference voltage.

Because the output of the diode 306 and transistor 232 circuit is a current rather than a voltage, the resultant comparator loop is not affected by voltage variations in the loop amplifier temperature operating point. Since Vbe is almost the same as the diode threshold voltage Vd, the bias current or base current is almost zero when there is no RF signal. Furthermore, since the two threshold voltages behave the same way over temperature, the bias condition also remains the same over temperature to provide the power level stability. In an ideal embodiment, the diode (or diode-connected transistor) 306 and transistor 232 will all be on one integrated circuit chip, thus having the same physical properties for proper temperature tracking.

Figure 4:
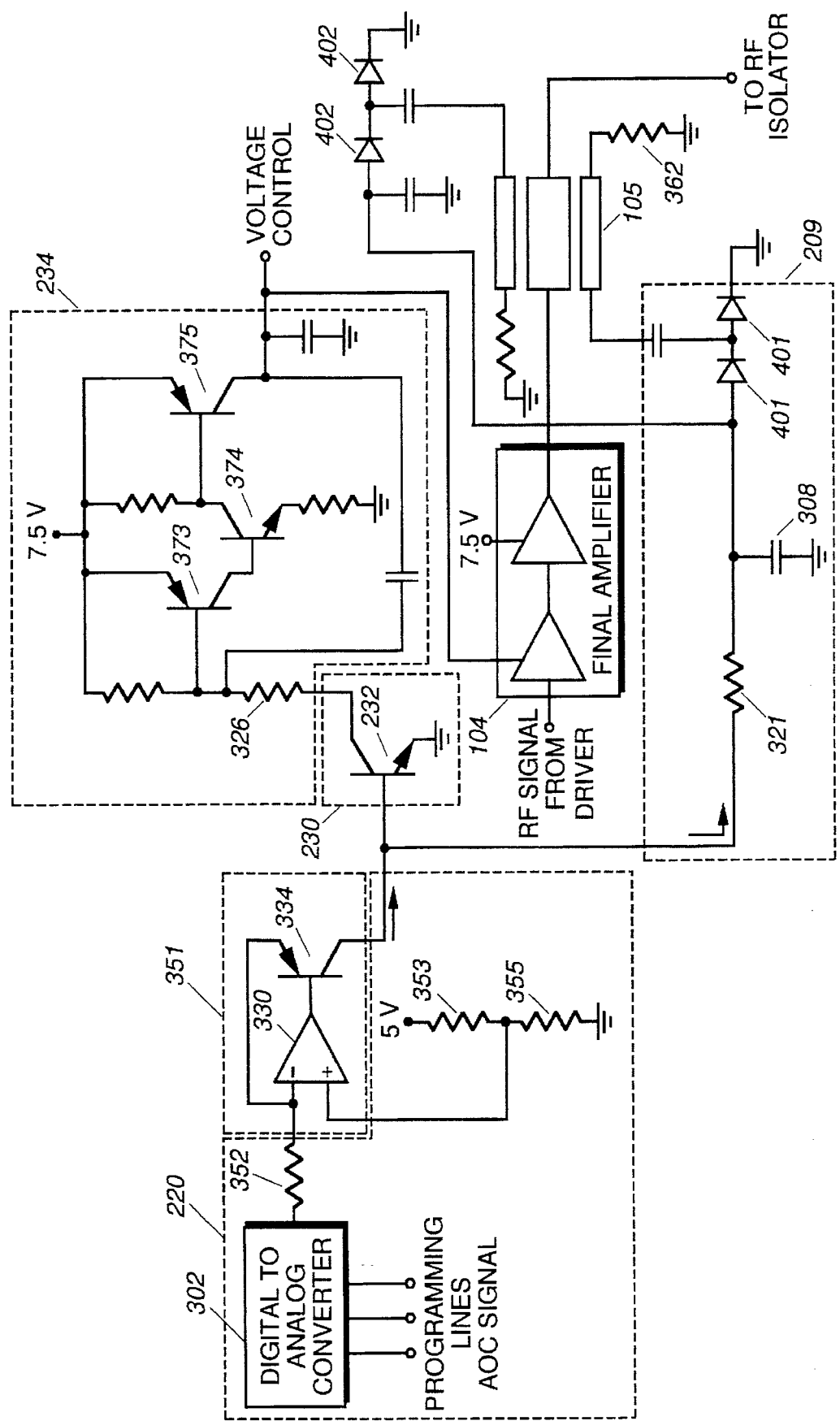
FIG. 4 is a detailed circuit diagram of the automatic output control circuitry of FIG. 2 using a doubler.

Referring to FIG. 4, the rectifies diode detector does not have to be a half-wave voltage rectifier as shown in FIG. 3. A Schottky diode full-wave doubler can be used instead. Schottky diodes 401 and 402 are configured as doublers. The advantage of the doubler is that at the same RF level the rectified voltage is twice as much as compared to the single rectifier. Temperature compensation is also possible because a dual Schottky diode threshold voltage is almost the same as the threshold voltage of a single normal diode which is similar to the base emitter voltage Vbe of the comparator transistor.

In summary, the current comparator implemented as a variable current amplifier varies the control voltage signal from the current amplifier to maintain the magnitude of the output of the power amplifier substantially the same as the magnitude of the reference voltage over a wide range of temperature at lower power settings. Hence, this improved automatic output control circuitry uses a closed-loop current feedback circuit provided by the automatic level control current comparator to sense the power output of the power amplifier and rectify that power output by way of at least one diode for controlling the gain of the power amplifier by adjusting the voltage control signal of the current amplifier.

What is claimed is:

1. A method for controlling an RF power amplifier output in an RF power amplifier comprising the steps of:

deriving a base bias current from a bipolar transistor having a base emitter voltage drop Vbe threshold voltage of a first magnitude and temperature variation;

biasing a diode rectifier having a diode threshold voltage (Vd) of a second magnitude and temperature variation about the same as the first magnitude for providing a sensed current of an opposite polarity from said base bias current;

summing said base bias current and said sensed current such that said first and second magnitude and temperature variations are canceled over temperature in a current node having an input, a first output connected to the base of said bipolar transistor, and a second output coupled to the anode of said diode rectifier;

current comparing a level of sensed current, that is representative of the RF power amplifier current state of said RF power amplifier, with a reference current;

providing said reference current for comparison with said sensed current and setting the RF power amplifier current state at said input of said current node; and providing an output that is coupled to said power amplifier so that the RF power amplifier current is maintained at an optimum level for minimizing temperature dependent variations and substantially leveling the power of said RF power amplifier.

2. An RF power amplifier level controlling circuit comprising:

a bipolar transistor having a base emitter voltage drop Vbe threshold voltage of a first magnitude and temperature variation for deriving a variable bias current;

bias means for providing said variable bias current to said bipolar transistor in response to a programmable reference signal;

a diode rectifier having a diode threshold voltage (Vd) of a second magnitude and temperature variation about the same as the first magnitude for providing a sensed current of an opposite polarity from said variable bias current; and a current node having an input connected to said bias means, a first output connected to the base of said bipolar transistor, and a second output coupled to the anode of said diode rectifier, for summing said variable bias current and said sensed current such that said first and second magnitude and temperature variations are canceled over temperature wherein said bipolar transistor maintains said variable bias current at a substantially constant level after the level has been determined by said programmable reference signal.

3. A radio comprising:

a transmitter section for modulating an RF signal;

an RF signal power amplifier for amplifying said modulated RF signal;

an antenna for radiating said amplified modulated RF signal; and a radio frequency RF signal power amplifier automatic output control (AOC) circuitry having a self-temperature compensated current comparator for controlling an output level of the RF signal power amplifier wherein said AOC circuitry comprises:

a bipolar transistor having a base emitter voltage drop (Vbe) threshold voltage of a first magnitude and temperature variation for deriving a base bias current;

a diode rectifier having a diode threshold voltage (Vd) of a second magnitude and temperature variation approximately as the first magnitude for providing a sensed current relating to said output level of said RF signal power amplifier and of an opposite polarity from said base bias current; and a current node having an input, a first output connected to the base of said bipolar transistor, and a second output coupled to the anode of said diode rectifier for summing said base bias current and said sensed current such that said first and second magnitude and temperature variations are canceled over temperature.

4. A radio frequency (RF) circuit for controlling power amplifier output in an RF power amplifier for a radio, the RF circuit comprising, a bipolar transistor having a base emitter voltage drop (Vbe) threshold voltage of a first magnitude and temperature variation for deriving a base bias current;

a diode rectifier having a diode threshold voltage (Vd) of a second magnitude and temperature variation substantially equal to the first magnitude for providing a sensed current of an opposite polarity from said base bias current;

a current node having an input, a first output connected to the base of said bipolar transistor, and a second output coupled to the anode of said diode rectifier for summing said base bias current and said sensed current such that said first and second magnitude and temperature variations are canceled over temperature;

means for providing a reference current connected to said input of said current node for comparing with said sensed current and for setting a RF power amplifier current state, and wherein said bipolar transistor compares a level of said sensed current, that is representative of the RF power amplifier current state of said RF power amplifier with said reference current and further wherein said bipolar transistor provides an output that is coupled to said RF power amplifier so that the RF power amplifier current is maintained at an optimum level for minimizing temperature dependent variations and substantially leveling the power of said RF power amplifier.

5. The RF circuit of claim 4, wherein said sensed current is indicative of a sensed RF voltage.

6. The RF circuit of claim 5, wherein said sensed RF voltage is direct-current (DC) voltage rectified by said diode rectifier for receiving a sample signal representative of the RF power amplifier output, said diode rectifier rectifying said sample signal to thereby provide for said sensed current.

7. The RF circuit of claim 6, wherein said sensed current is indicative of the current flowing through said diode rectifier.

8. The RF circuit of claim 6, wherein said diode rectifier is a half wave diode rectifier having an anode coupled to said sensed RF voltage.

9. The RF circuit of claim 6, wherein said diode rectifier is a half wave diode rectifier having a cathode coupled to said sensed RF voltage.

10. The RF circuit of claim 6, wherein said diode rectifier is a Schottky diode doubler full-wave rectifier.

11. The RF circuit of claim 4, wherein said bipolar transistor comprises a bipolar emitter coupled transistor having a base input node for receiving said reference current and said sensed current to derive said base bias current, and a collector output for controlling the RF power amplifier current state of said power amplifier in response to said base bias current.

12. The RF circuit of claim 11, wherein said base bias current is substantially reduced when said sensed current is increased about the value of said reference current.

13. An RF current comparator automatic output control (AOC) comprising:

an input source for providing a reference current;

an amplifier gain stage having an input and an output;

an RF final amplifier having an input for receiving an input signal and an output for providing an RF output signal in response to said output from said amplifier gain stage;

a bipolar transistor having a base emitter voltage drop (Vbe) threshold voltage of a first magnitude and temperature variation for deriving a base bias current with varying base current conditions, where said bipolar transistor comprises an emitter-coupled transistor having a base input coupled to a current node, a collector output, and three transistor operating regions for controlling the collector output in response to the base input;

a diode rectifier having a diode threshold voltage (Vd) of a second magnitude and temperature variation about the same as the first magnitude for receiving a sample signal negatively representative of said RF amplifier output signal, said diode rectifier rectifying said sample signal to thereby provide for a detector current and said diode rectifier providing said detector current of an opposite polarity from said base bias current; and wherein the current node having an input connected to said input source, a first output connected to the base of said bipolar transistor, and a second output coupled to the anode of said diode rectifier, for summing said base bias current and said detector current such that said first and second magnitude and temperature variations are canceled over temperature and for comparing said detector current of said diode rectifier with said reference current to obtain one of three signal conditions: a first greater than reference current cut-off condition, a second much less than reference saturated current condition, or about equal steady-state condition; and further wherein said three transistor operating regions include:

a first cut-off region wherein the base input has said base bias current with an insufficient base current condition for de-activating the transistor and providing an insufficient collector current as an input to the amplifier gain stage to reduce the gain of the amplifier gain stage in response to said first greater than reference current signal condition;

a second saturation mode wherein the base input has said base bias current with an exceedingly large base current condition for providing a maximum collector current as an input to the amplifier gain stage for maximally adjusting the output of said amplifier in relation to a maximum of said reference current magnitude to thereby maintain a maximum gain amplifier output signal in response to said second much less than reference current condition; and a third active mode wherein the base input has said base bias current with a linear range of base current conditions for providing a linearly-related collector current as an input to the amplifier gain stage for linearly adjusting the output of said amplifier gain stage in relation to said reference current to thereby maintain a desired amplifier RF output signal in response to said third about equal signal condition.

14. The RF current comparator AOC of claim 13 wherein said input source comprises a programmable reference current source for providing said reference current that is representative of the RF final amplifier output signal.

15. The RF current comparator AOC of claim 13 wherein said input source comprises:

means for storing a plurality of programming voltages, each programming voltage being representative of a given range for the amplifier output signal; and controller means for providing one of said programming voltages to derive said reference current.

* * * * *